US006825526B1

(12) United States Patent
He et al.

(10) Patent No.: US 6,825,526 B1
(45) Date of Patent: Nov. 30, 2004

(54) STRUCTURE FOR INCREASING DRIVE CURRENT IN A MEMORY ARRAY AND RELATED METHOD

(75) Inventors: Yue-Song He, San Jose, CA (US); Nian Yang, Mountain View, CA (US); Zhigang Wang, Sunnyvale, CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 0 days.

(21) Appl. No.: 10/759,809

(22) Filed: Jan. 16, 2004

(51) Int. Cl.[7] .................................... H01L 29/788
(52) U.S. Cl. ...................... 257/317; 257/315
(58) Field of Search ........................ 257/317, 315

(56) References Cited

U.S. PATENT DOCUMENTS 6,462,373 B2 * 10/2002 Shimizu et al. ............ 257/315
6,583,060 B2 * 6/2003 Trivedi ...................... 438/700

* cited by examiner

Primary Examiner—David Nelms
Assistant Examiner—Tu-Tu Ho
(74) Attorney, Agent, or Firm—Farjami & Farjami LLP

(57) ABSTRACT

According to one exemplary embodiment, a memory array comprises first and second isolation regions situated in a substrate, where the first and second isolation regions are separated by a separation distance. The memory array further comprises a trench situated between the first and second isolation regions, where the trench defines trench sidewalls and a trench bottom in the substrate. The memory array further comprises a tunnel oxide layer situated between the first and second isolation regions, where the tunnel oxide layer is situated on the trench sidewalls and the trench bottom. According to this embodiment, the memory array further comprises a channel region situated underneath the tunnel oxide layer and extending along the trench sidewalls and the trench bottom, where the channel region has an effective channel width, where the effective channel width increases as a height of the trench sidewalls increases.

20 Claims, 8 Drawing Sheets

STRUCTURE FOR INCREASING DRIVE CURRENT IN A MEMORY ARRAY AND RELATED METHOD

TECHNICAL FIELD

The present invention is generally in the field of semiconductor fabrication. More particularly, the present invention is in the field of fabrication of memory arrays.

BACKGROUND ART

Non-volatile memory arrays are currently in widespread use in electronic components that require the retention of information when electrical power is terminated. Non-volatile memory arrays include read-only-memory (ROM), programmable-read-only memory (PROM), erasable-programmable-read-only-memory (EPROM), and electrically-erasable-programmable-read-only-memory (EEPROM) arrays. EEPROM devices differ from other non-volatile memory arrays in that they can be electrically programmed and erased. Flash memory arrays are similar to EEPROM arrays in that memory cells can be programmed and erased electrically. However, flash memory arrays enable the erasing of all memory cells in the memory array using a single current pulse.

Product development efforts in flash memory arrays have focused on increasing the programming speed, lowering programming and reading voltages, increasing data retention time, reducing cell erasure times, reducing cell dimensions, and increasing drive current. By reducing cell dimensions, flash memory arrays can achieve increased speed and reduced power consumption. As the flash memory cell is reduced in size, the flash memory cell's channel width is also reduced in size, which reduces the size of the flash memory array. By way of background, in a floating gate flash memory array, channel width can be defined as the distance between adjacent isolation regions, such as shallow trench isolation (STI) regions. The drive current, which refers to the current that flows between drain and source regions of the flash memory array, can be increased by the increasing the channel width. However, in a conventional flash memory array, an increase in channel width causes an undesirably increase in the size of the flash memory array.

Thus, there is a need in the art for a flash memory array, such as a floating gate flash memory array, having increased drive current, where the increased drive current is achieved without increasing the size of the flash memory array.

SUMMARY

The present invention is directed to structure for increasing drive current in a memory array and related method. The present invention addresses and resolves the need in the art for a flash memory array, such as a floating gate flash memory array, having increased drive current, where the increased drive current is achieved without increasing the size of the flash memory array.

According to one exemplary embodiment, a memory array comprises first and second isolation regions situated in a substrate, where the first and second isolation regions are separated by a separation distance. The memory array may be, for example, a floating gate flash memory array. The memory array further comprises a trench situated between the first and second isolation regions, where the trench defines trench sidewalls and a trench bottom in the substrate. The memory array further comprises a tunnel oxide layer situated between the first and second isolation regions, where the tunnel oxide layer is situated on the trench sidewalls and the trench bottom.

According to this embodiment, the memory array further comprises a channel region situated underneath the tunnel oxide layer, where the channel region extends along the trench sidewalls and trench bottom, where the channel region has an effective channel width, and where the effective channel width increases as a height of the trench sidewalls increases. The increase in the effective channel width causes an increase in the drive current in the memory array. The memory array might further comprise a floating gate layer situated over the tunnel oxide layer, where the floating gate layer is situated in the trench. The memory array might further comprise an ONO stack situated over the floating gate layer. The memory array might further comprise a word line situated over the ONO stack.

According to one embodiment, the invention is a method for achieving the above-described memory array. Other features and advantages of the present invention will become more readily apparent to those of ordinary skill in the art after reviewing the following detailed description and accompanying drawings.

DETAILED DESCRIPTION OF THE INVENTION

The present invention is directed to structure for increasing drive current in a memory array and related method. The following description contains specific information pertaining to the implementation of the present invention. One skilled in the art will recognize that the present invention may be implemented in a manner different from that specifically discussed in the present application. Moreover, some of the specific details of the invention are not discussed in order not to obscure the invention.

The drawings in the present application and their accompanying detailed description are directed to merely exemplary embodiments of the invention. To maintain brevity, other embodiments of the present invention are not specifically described in the present application and are not specifically illustrated by the present drawings.

FIGS. 1A, 1B, 2A, 2B, 3A, 3B, 4A and 4B illustrate the fabrication of a floating gate memory array, such as a floating gate flash memory array, according to one embodiment of the present invention. Although a floating gate memory array is utilized to illustrate the present invention, the present invention can also be applied to memory arrays comprising memory cells capable of storing two independent bits in separate locations within the memory cell, such as Advanced Micro Devices' (AMD) MirrorBit™ memory cells.

Figure 1A:
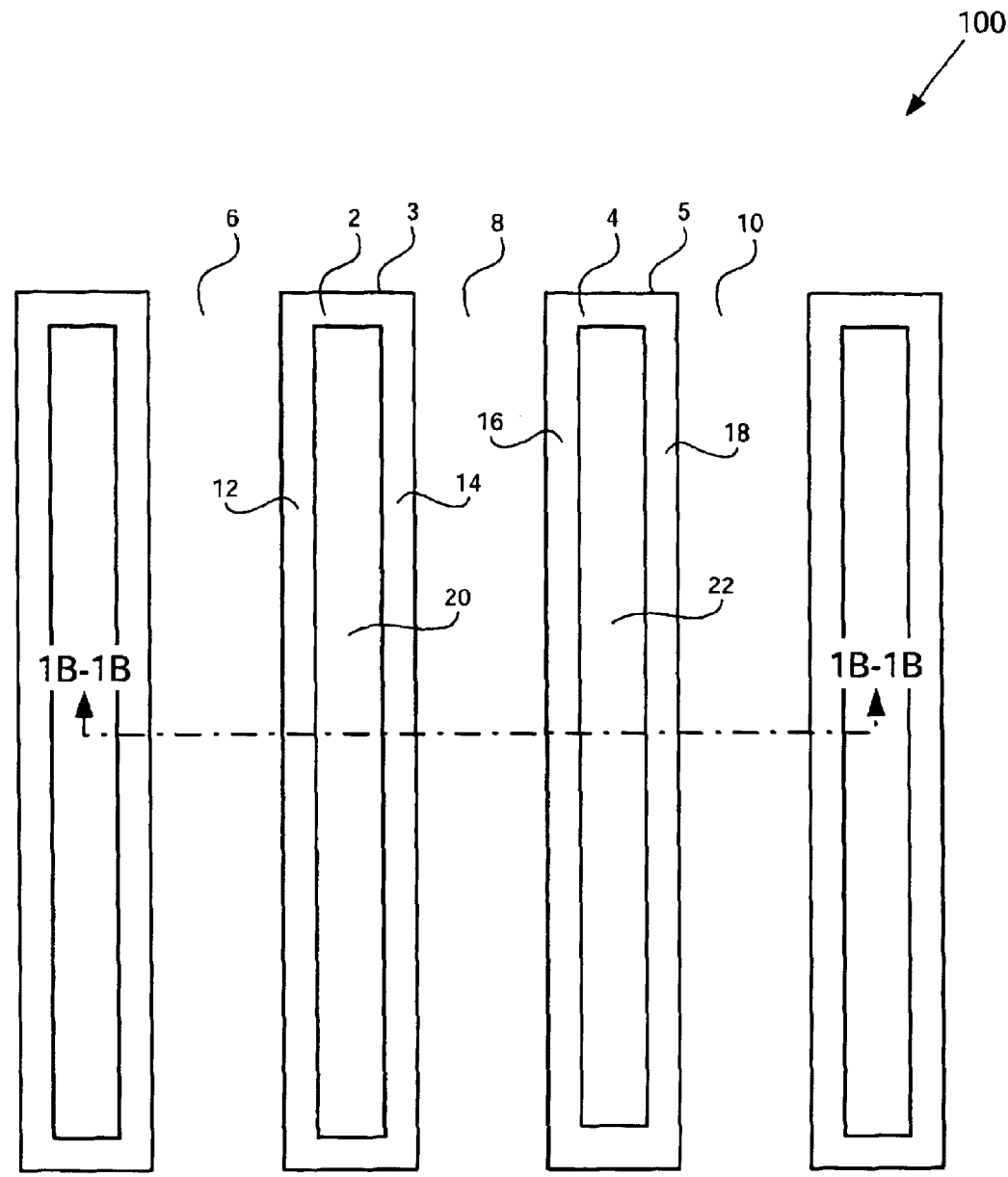
FIG. 1A illustrates a top view of some of the features of a memory array in an intermediate stage of fabrication, formed in accordance with one embodiment of the present invention.

FIG. 1A shows a top view of an exemplary floating gate memory array in an intermediate stage of fabrication in accordance with one embodiment of the present invention structure. Structure 100 includes source/drain regions 2 and 4, bit lines 3 and 5, isolation regions 6, 8, and 10, spacers 12, 14, 16, and 18, and trenches 20 and 22. Structure 100 can be, for example, a floating gate memory array, such as a floating gate flash memory array, in an intermediate stage of fabrication. It is noted that in FIG. 1A, only source/drain regions 2 and 4, bit lines 3 and 5, spacers 12, 14, 16, and 18, and trenches 20 and 22 are specifically discussed herein to preserve brevity.

As shown in FIG. 1A, source/drain region 2 and bit line 3 are situated between isolation regions 6 and 8 and source/drain region 4 and bit line 5 are situated between isolation regions 8 and 10. Bit lines 3 and 5 and source/drain regions 2 and 4 can be formed in a substrate (not shown in FIG. 1A) in a manner know in the art. Isolation regions 6, 8, and 10 can be, for example, shallow trench isolation (STI) regions and can comprise silicon dioxide or other appropriate dielectric material. Isolation regions 6, 8, and 10 can be fabricated in a substrate (not shown in FIG. 1A) in a manner known in the art. Also shown in FIG. 1A, trench 20 is situated between spacers 12 and 14 in source/drain region 2 and trench 22 is situated between spacers 16 and 18 in source/drain region 4. Trench 20 can be formed by performing a self-aligned source/drain etch to etch a trench, i.e. trench 20, that is self-aligned to source/drain region 2 along bit line 3. Similarly, trench 22 can be formed by utilizing a self-aligned source/drain etch to etch a trench, i.e. trench 22, that is self-aligned to source/drain region 4 along bit line 5.

Figure 1B:
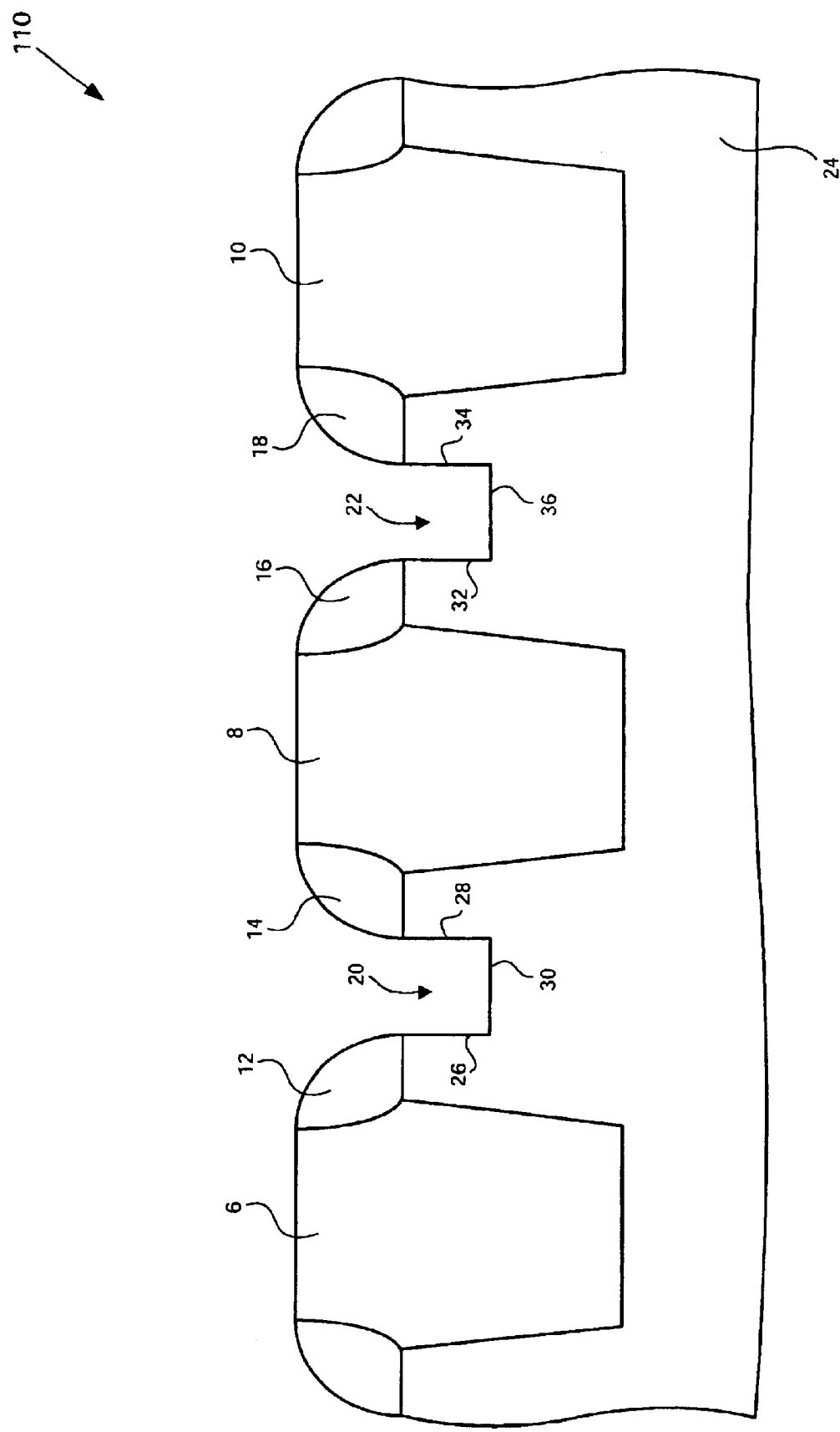
FIG. 1B illustrates a cross-sectional view along the line 1B—1B in FIG. 1A of the structure of FIG. 1A.

Referring to FIG. 1B, structure 110 in FIG. 1B corresponds to a cross-sectional view of structure 100 along line 1B—1B in FIG. 1A. As shown in FIG. 1B, isolation regions 6, 8, and 10 are situated in substrate 24. Also shown in FIG. 1B, trench 20 defines sidewalls 26 and 28 and bottom 30 in substrate 24 and trench 22 defines sidewalls 32 and 34 and bottom 36 in substrate 24. Further shown in FIG. 1B, spacers 12 and 14 are situated adjacent to respective sidewalls 26 and 28 of trench 20 and spacers 16 and 18 are situated adjacent to respective sidewalls 32 and 34 of trench 22.

Figure 2A:
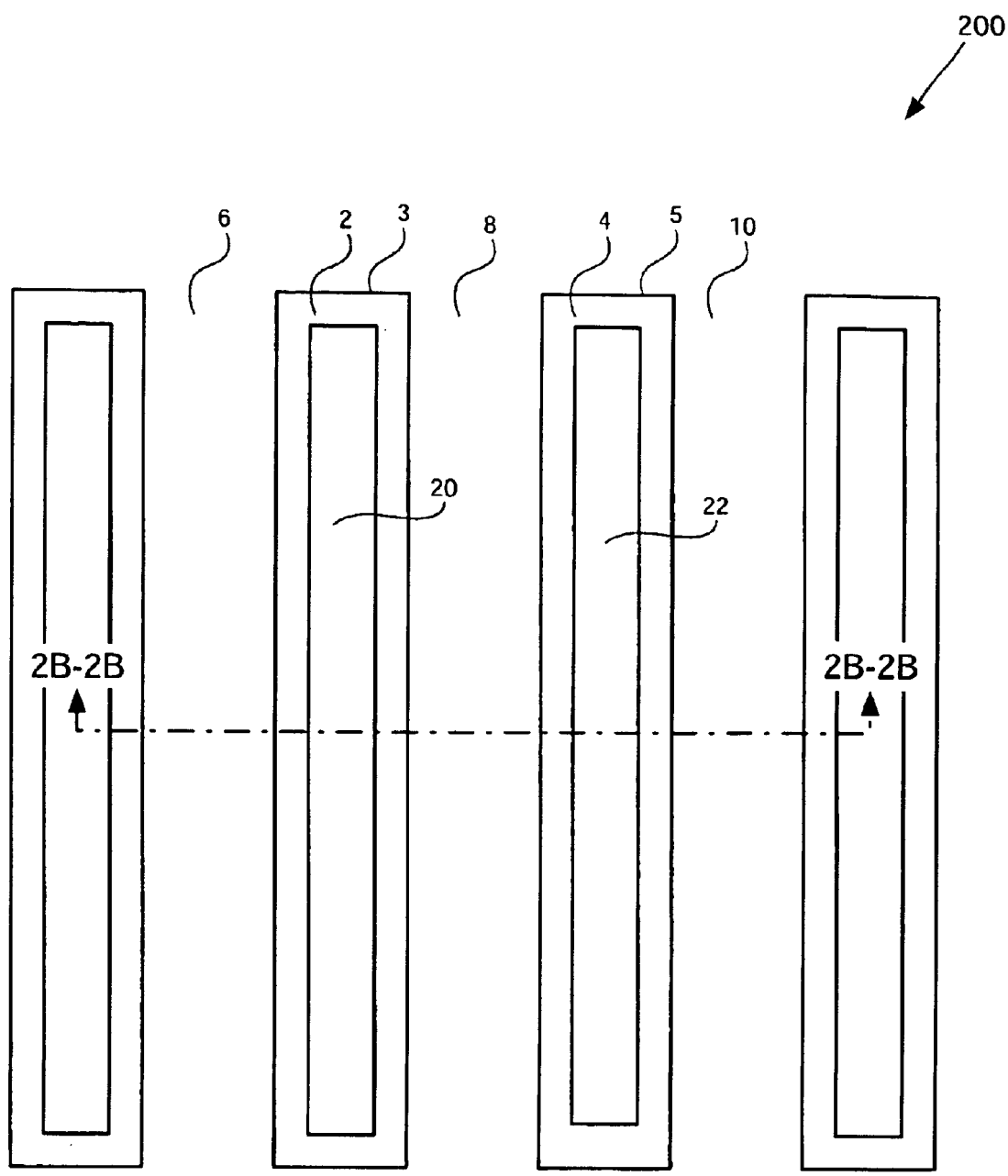
FIG. 2A illustrates a top view of some of the features of a memory array in an intermediate stage of fabrication, formed in accordance with one embodiment of the present invention.

FIG. 2A shows a top view of structure 200, which corresponds to structure 100 in FIG. 1A after performance of spacer removal, liner oxidation, and core threshold (Vt) implant steps. Thus, in structure 200 in FIG. 2A, spacers 12, 14, 16, and 18 have been removed, an oxide liner has been formed in source/drain regions 2 and 4, including respective trenches 20 and 22, and a core Vt implant has been performed in source/drain regions 2 and 4.

Figure 2B:
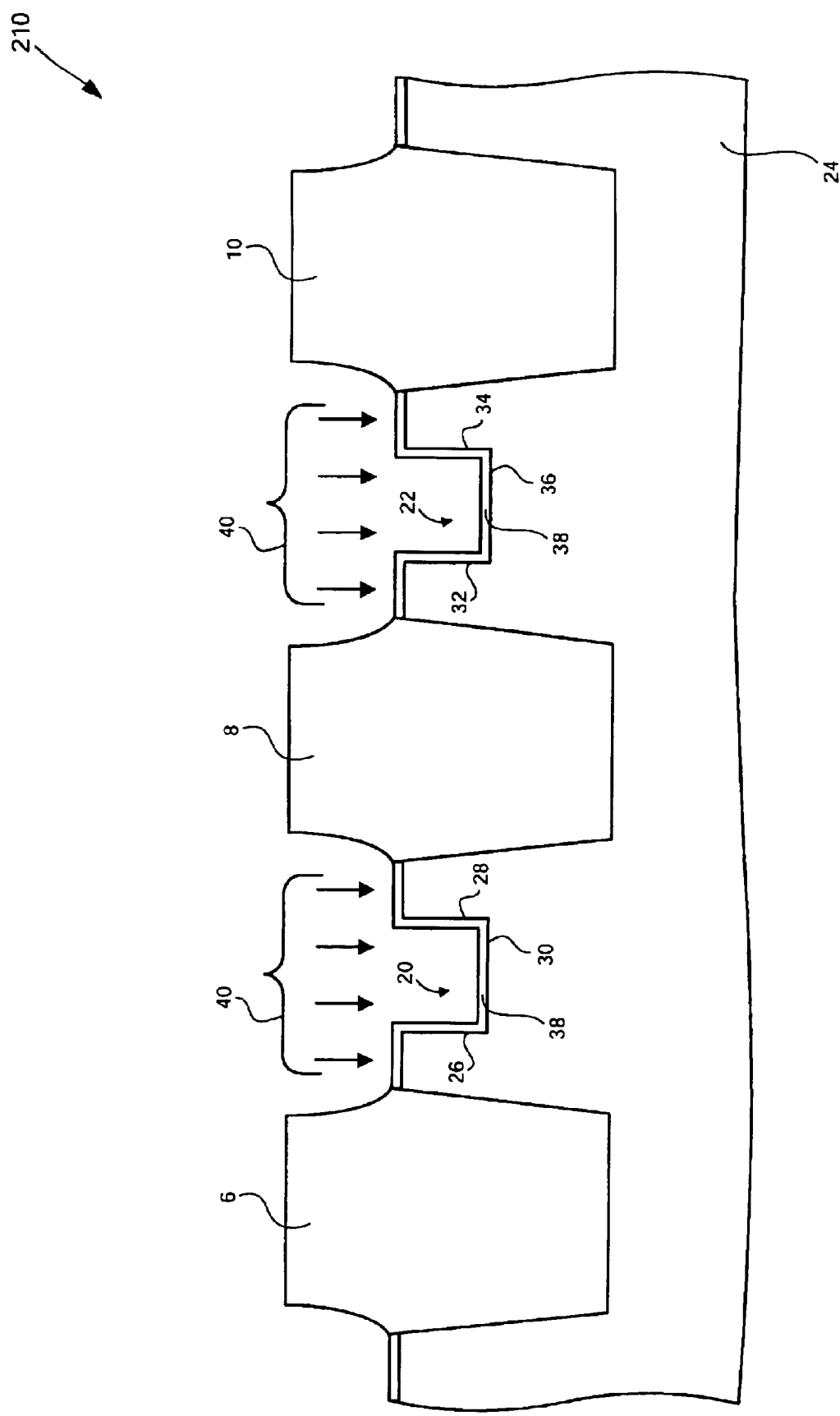
FIG. 2B illustrates a cross-sectional view along the line 2B—2B in FIG. 2A of the structure of FIG. 2A.

Referring to FIG. 2B, structure 210 corresponds to a cross-sectional view of structure 200 along line 2B—2B in FIG. 2A. As shown in FIG. 2B, oxide liner 38 is situated on sidewalls 26 and 28 and bottom 30 of trench 20 and on top surface of substrate 24 between sidewalls 26 and 28 and respective isolation regions 6 and 8. Oxide liner 38 is also situated on sidewalls 32 and 34 and bottom 36 of trench 22 and on top surface of substrate 24 between sidewalls 32 and 34 and respective isolation regions 8 and 10. Oxide liner 38 can comprise a thin layer of sacrificial oxide, which can be formed in an oxidation process for the purpose of reversing or counteracting damage to top surface of substrate 24 caused by etching of trenches 20 and 22.

Also shown in FIG. 2B, core Vt implant 40 is performed in source/drain regions 2 and 4. Core Vt implant 40 can pass through thin oxide liner 38 into portions of substrate 24 situated underneath oxide liner 38 and can be performed in a manner known in the art.

Figure 3A:
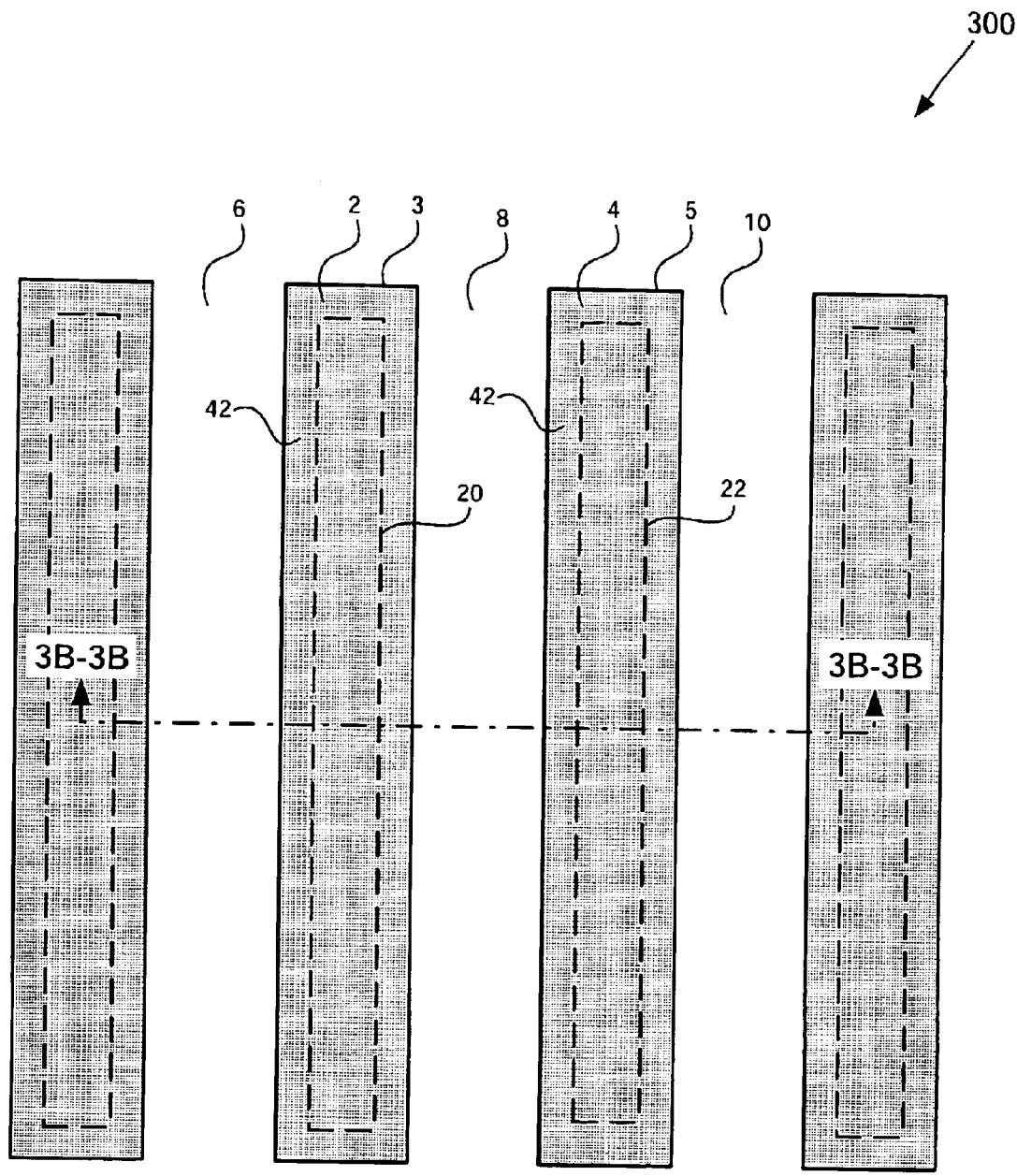
FIG. 3A illustrates a top view of some of the features of a memory array in an intermediate stage of fabrication, formed in accordance with one embodiment of the present invention.

FIG. 3A shows a top view of structure 300, which corresponds to structure 200 in FIG. 2A after performance of oxide liner removal and clean, tunnel oxide layer formation, floating gate layer formation, and chemical mechanical polish (CMP) steps. As shown in FIG. 3A, floating gate layer 42 is situated in source/drain regions 2 and 4, including trenches 20 and 22.

Figure 3B:
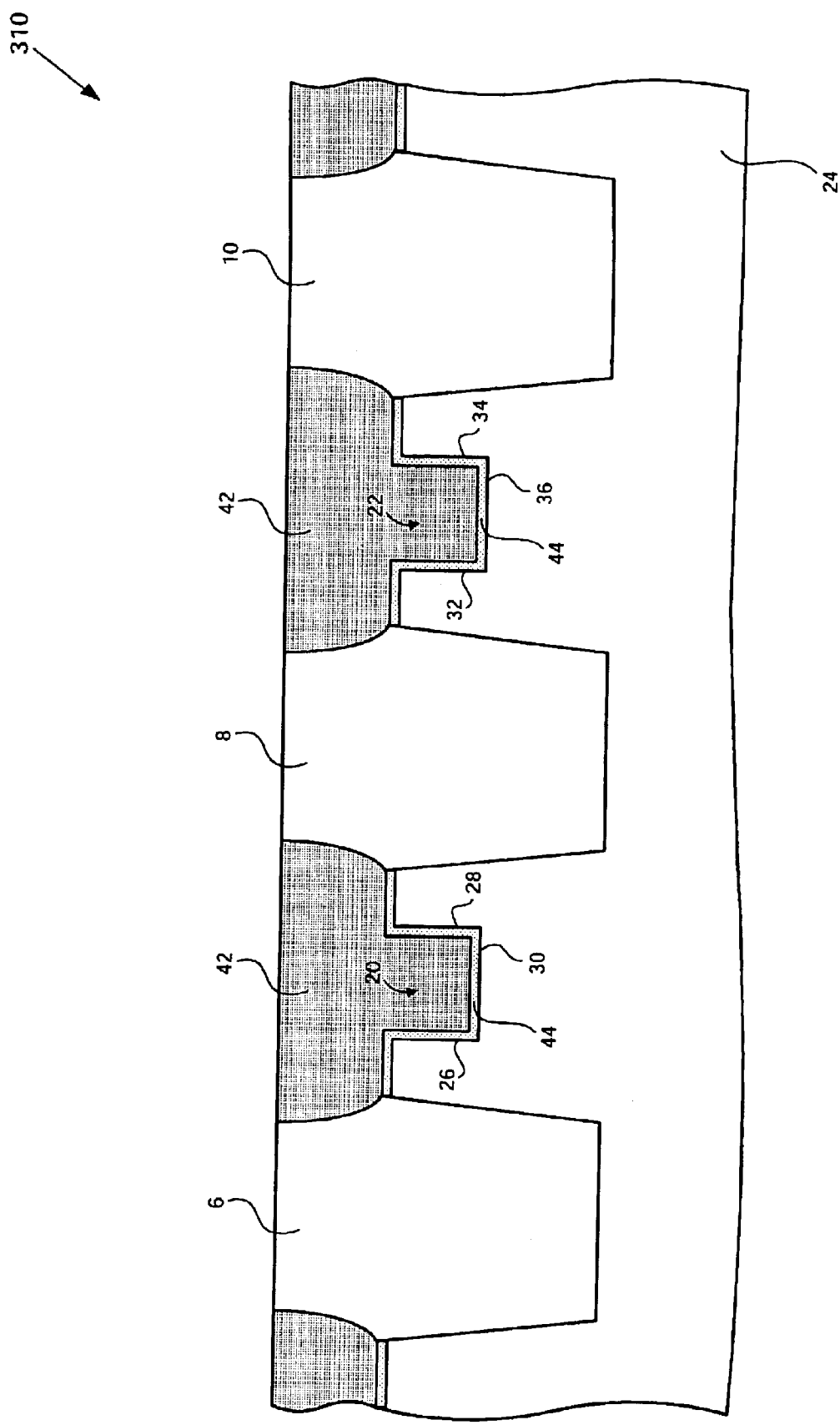
FIG. 3B illustrates a cross-sectional view along the line 3B—3B in FIG. 3A of the structure of FIG. 3A.

Referring to FIG. 3B, structure 310 corresponds to a cross-sectional view of structure 300 along line 3B—3B in FIG. 3A. As shown in FIG. 3B, tunnel oxide layer 44 is situated on sidewalls 26 and 28 and bottom 30 of trench 20 and on top surface of substrate 24 between sidewalls 26 and 28 and respective isolation regions 6 and 8. Tunnel oxide layer 44 is also situated on sidewalls 32 and 34 and bottom 36 of trench 22 and on top surface of substrate 24 between sidewalls 32 and 34 and respective isolation regions 8 and 10. Tunnel oxide layer 44 can comprise thermally grown tunnel oxide, which can be formed in a manner known in the art.

Also shown in FIG. 3B, floating gate layer 42 is situated on tunnel oxide layer 44 and situated between adjacent isolation regions, i.e. between isolation regions 6 and 8 and isolations regions 8 and 10. Floating gate layer 42 can comprise polycrystalline silicon (also referred to as polysilicon), which can be deposited on tunnel oxide layer 44 by utilizing, for example, a low pressure chemical vapor deposition (LPCVD) process or other appropriate process. As a result of performance of a CMP step, the top surface of floating gate layer 42 is substantially planar.

Figure 4A:
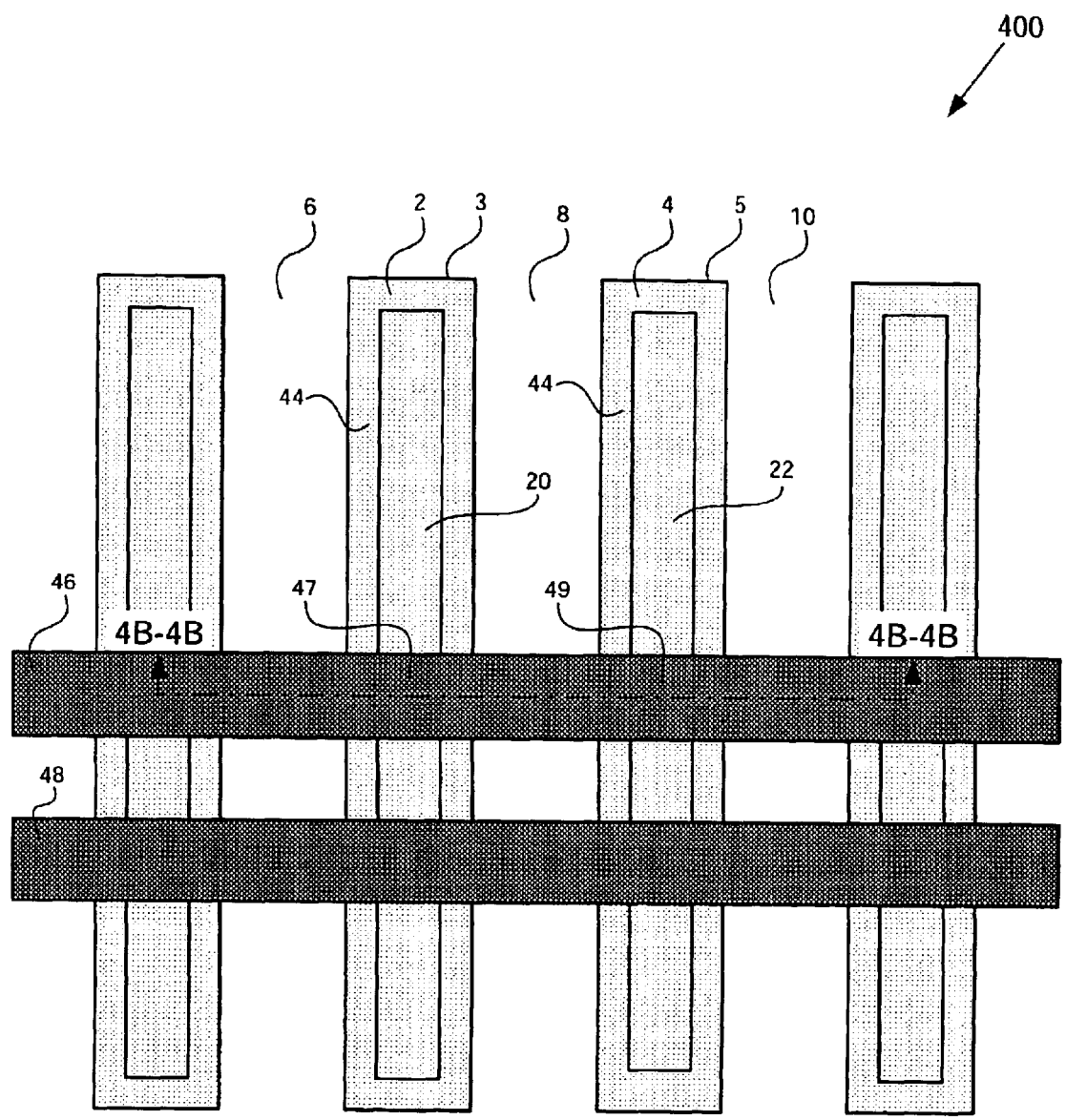
FIG. 4A illustrates a top view of some of the features of a memory array in an intermediate stage of fabrication, formed in accordance with one embodiment of the present invention.

FIG. 4A shows a top view of structure 400, which corresponds to structure 300 in FIG. 3A after performance of ONO (Oxide-Nitride-Oxide) stack deposition and etch, word line layer deposition, and stacking gate etch steps. As shown in FIG. 4A, word lines 46 and 48 are situated over and aligned perpendicular to bit lines 3 and 5. An ONO stack (not shown in FIG. 4A) is situated underneath word lines 46 and 48. Word lines 46 and 48 can comprise polysilicon or other appropriate conductive material. Word lines 46 and 48 can be formed by, for example, depositing a layer of polysilicon over the ONO stack (not shown in FIG. 4A) and appropriately etching the layer of polysilicon.

Also shown in FIG. 4A, portions of tunnel oxide layer 44 situated over source/drain regions 2 and 4 and not covered, i.e. masked, by word lines 46 and 48 are exposed as a result of the stacking gate etch step. Word lines 46 and 48 are situated between source regions and drain regions, which are situated underneath tunnel oxide layer 44. Further shown in FIG. 4A, floating gate memory cells 47 and 49 are situated at the intersection of word line 46 and respective bit lines 3 and 5. It is noted that although only floating gate memory cells 47 and 49 are particularly described in FIG. 4A to preserve brevity, a floating gate memory cell is situated at each intersection of a word line and a bit line.

Figure 4B:
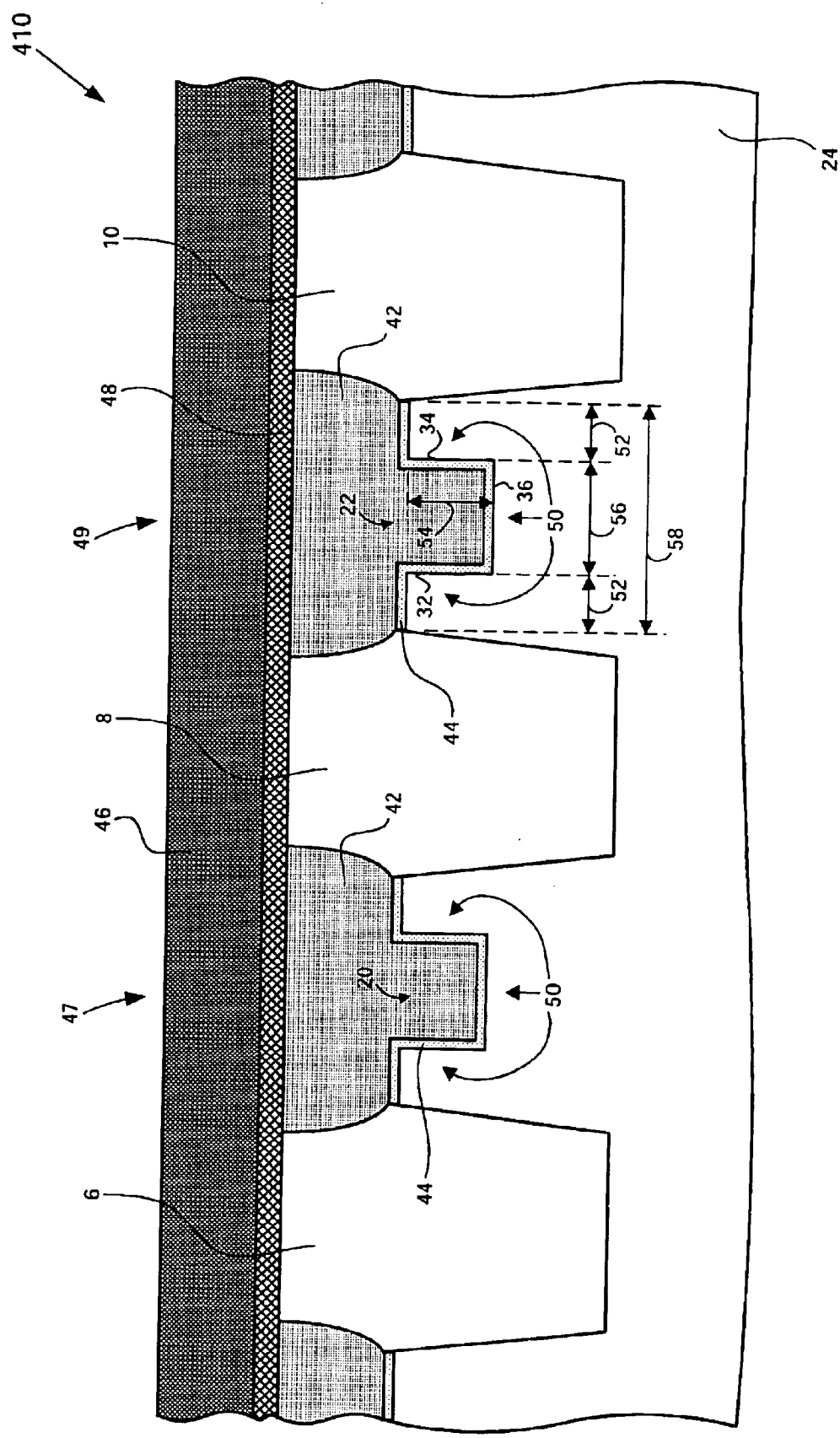
FIG. 4B illustrates a cross-sectional view along the line 4B—4B in FIG. 4A of the structure of FIG. 4A.

Referring to FIG. 4B, structure 410 corresponds to a cross-sectional view of structure 400 along line 4B—4B in FIG. 4A. As shown in FIG. 4B, ONO stack 48 is situated over floating gate layer 42 and isolation regions 6, 8, and 10. ONO stack 48 is a three-layer structure, which comprise a bottom layer of silicon oxide, a middle layer of silicon nitride, and a top layer of silicon oxide. ONO stack 48 can be formed by sequentially forming layers of silicon oxide, silicon nitride, and silicon oxide over floating gate layer 42 and isolation regions 6, 8, and 10 to form an ONO layer, which can be patterned in a manner known in the art to form ONO stack 48. Also shown in FIG. 4B, word line 46 is situated over ONO stack 48. Further shown in FIG. 4B, floating gate memory cell 47 is situated between isolation regions 6 and 8 and floating gate memory cell 49 is situated between isolation regions 8 and 10. Floating gate memory cells 47 and 49 each comprise segments of word line 46, ONO stack 48, floating gate layer 42, and tunnel oxide layer 44.

Further shown in FIG. 4B, channel region 50 is formed underneath tunnel oxide layer 44 and between adjacent isolation regions, such as isolation regions 6 and 8. Since tunnel oxide layer 44 is formed on sidewalls and bottom of a trench, such as trench 22, which is formed between adjacent isolation regions, channel region 50 extends along the sidewalls and bottom of the trench, such as sidewalls 32 and 34 and bottom 36 of trench 22. As a result, the present invention achieves an effective channel width that is greater than the separation distance between adjacent isolation regions, i.e. separation distance 58. The effective channel width can be approximately equal to (2×distance 52)+(2× height 54)+width 56, where distance 52 is the distance between a trench sidewall and an isolation region, height 54 is the height of trench sidewalls, such as sidewalls 32 and 34 of trench 22, and width 56 is the trench width, such as the width of trench 22. Thus, the effective channel width is also approximately equal to the length of tunnel oxide layer 44 situated between adjacent isolation regions, such as isolation regions 6 and 8. By way of example, where distance 52 is equal to 10.0 nanometers (nm), height 54 is equal to 40.0 nm, and width 56 is equal to 40.0 nm, the effective channel width can be approximately equal to 140.0 nm.

In contrast, in a conventional floating gate memory array, conventional channel width is approximately equal to the separation distance between adjacent isolation regions, i.e. separation distance 58. Thus, in the above example, the conventional channel width would be equal to 60.0 nm, i.e. (2×distance 52 (10.0 nm))+width 56 (40.0 nm). Thus, by providing a trench between adjacent isolation regions, the present invention achieves an effective channel width that is greater than the distance between adjacent isolation regions. Furthermore, by increasing the height of the sidewalls of the trench formed between adjacent isolation regions, the present invention can increase the effective channel width of a floating gate memory array without increasing the distance between adjacent isolation regions and, consequently, without increasing the size of the floating gate memory array.

By way of background, an increase in channel width causes an increase in the amount of drive current that can flow through the channel region in a memory array, such as a floating gate memory array. Thus, by increasing the effective channel width, the present invention achieves a memory array, such as a floating gate memory array, that can advantageously provide increased drive current without a concomitant increase in memory array size.

From the above description of exemplary embodiments of the invention it is manifest that various techniques can be used for implementing the concepts of the present invention without departing from its scope. Moreover, while the invention has been described with specific reference to certain embodiments, a person of ordinary skill in the art would recognize that changes could be made in form and detail without departing from the spirit and the scope of the invention. The described exemplary embodiments are to be considered in all respects as illustrative and not restrictive. It should also be understood that the invention is not limited to the particular exemplary embodiments described herein, but is capable of many rearrangements, modifications, and substitutions without departing from the scope of the invention.

Thus, structure for increasing drive current in a memory array and related method have been described.

What is claimed is:

1. A memory array comprising:

first and second isolation regions situated in a substrate, said first and second isolation regions being separated by a separation distance;

a trench situated between said first and second isolation regions, said trench defining trench sidewalls and a trench bottom in said substrate;

a tunnel oxide layer situated between said first and second isolation regions, said tunnel oxide layer being situated on said trench sidewalls and said trench bottom;

a channel region situated underneath said tunnel oxide layer, said channel region extending along said trench sidewalls and said trench bottom, said channel region having an effective channel width, wherein said effective channel width corresponds to a height of said trench sidewalls;

wherein said effective channel width is greater than said separation distance between said first and said second isolation regions.

2. The memory array of claim 1 wherein an increase in said height of said trench sidewalls causes an increase in said effective channel width.

3. The memory array of claim 2 wherein said increase in said effective channel width causes an increase in a drive current in said memory array.

4. The memory array of claim 1 further comprising a floating gate layer situated over said tunnel oxide layer, said floating gate layer being situated in said trench.

5. The memory array of claim 4 further comprising an ONO stack situated over said floating gate layer.

6. The memory array of claim 5 further comprising a word line situated over said ONO stack.

7. The memory array of claim 1 wherein said memory array is a floating gate flash memory array.

8. A memory array comprising first and second isolation regions situated in a substrate, said first and second isolation regions being separated by a separation distance, a tunnel oxide layer situated between said first and second isolation regions, a channel region situated underneath said tunnel oxide layer, said memory array being characterized by:

a trench situated between said first and second isolation regions, said trench defining trench sidewalls and a trench bottom in said substrate, said tunnel oxide layer being situated on said trench sidewalls and said trench bottom, said channel region extending along said trench sidewalls and said trench bottom, said channel region having an effective channel width, wherein said effective channel width corresponds to a height of said trench sidewalls, wherein said effective channel width is greater than said separation distance between said first and second isolation regions.

9. The memory array of claim 8 wherein an increase in said height of said trench sidewalls causes an increase in said effective channel width.

10. The memory array of claim 8 wherein said increase in said effective channel width causes an increase in a drive current in said memory array.

11. The memory array of claim 8 further comprising a floating gate layer situated over said tunnel oxide layer, said floating gate layer being situated in said trench.

12. The memory array of claim 11 further comprising an ONO stack situated over said floating gate layer.

13. The memory array of claim 12 further comprising a word line situated over said ONO stack.

14. The memory array of claim 8 wherein said memory array is a floating gate flash memory array.

15. A method for fabricating a memory array, said method comprising steps of:

forming a trench between first and second isolation regions in a substrate, said trench defining trench sidewalls and a trench bottom in said substrate, said first and second isolation regions being separated by a separation distance;

forming a tunnel oxide layer between said first and second isolation regions, said tunnel oxide layer being formed on said trench sidewalls and said trench bottom;

forming a channel region underneath said tunnel oxide layer, said channel region extending along said trench sidewalls and said trench bottom, said channel region having an effective channel width, wherein said effective channel width corresponds to a height of said trench sidewalls;

wherein said effective channel width is greater than said separation distance between said first and second isolation regions.

16. The method of claim 15 wherein an increase in said height of said trench sidewalls causes an increase in said effective channel width.

17. The method of claim 16 wherein said increase in said effective channel width causes an increase in a drive current in said memory array.

18. The method of claim 15 further comprising a step of forming a floating gate layer over said tunnel oxide layer and in said trench.

19. The method of claim 18 further comprising a step of forming an ONO stack over said floating gate layer.

20. The method of claim 19 wherein said memory array is a floating gate flash memory array.

\* \* \* \* \*